United States Patent [19]

Briganti

[11] Patent Number: 5,566,584
[45] Date of Patent: Oct. 22, 1996

[54] FLEXURE SUPPORT FOR A FIXTURE POSITIONING DEVICE

[75] Inventor: Joseph Briganti, Monroe, Conn.

[73] Assignee: Beta Squared, Inc., Brookfield, Conn.

[21] Appl. No.: 522,014

[22] Filed: Aug. 31, 1995

[51] Int. Cl.⁶ ............................. B23Q 1/25; G03B 27/53
[52] U.S. Cl. ........................ 74/490.07; 269/73; 355/72
[58] Field of Search ..................... 74/490.07, 490.08; 269/73; 378/34; 248/562, 604; 430/22; 437/8, 924; 355/72, 73

[56] References Cited

U.S. PATENT DOCUMENTS

| | | | |
|---|---|---|---|
| 3,569,718 | 3/1971 | Borner | 437/924 X |
| 3,830,592 | 8/1974 | Kato et al. | 355/73 |
| 4,997,158 | 3/1991 | James | 248/604 |
| 5,022,619 | 6/1991 | Mamada | 269/73 X |

Primary Examiner—Charles A. Marmor
Assistant Examiner—Troy Grabow
Attorney, Agent, or Firm—William C. Crutcher

[57] ABSTRACT

An improved flexure support for a movable wafer or mask holders in photolithographic projection machines, comprising a long slender wire extending between the positioning device and the holder along the X or Y axis so as to constrain the holder to move along the axis while permitting substantial freedom of movement of the holder in a direction perpendicular to the wire by flexing, a bracket housing attached either to the holder or the positioning device with a hollow cavity filled with elastomeric material, and a plate in the cavity and attached to one end of the wire, to permit limited movement of the holder along the axis while it is being restrained against such movement by the positioning device.

8 Claims, 3 Drawing Sheets

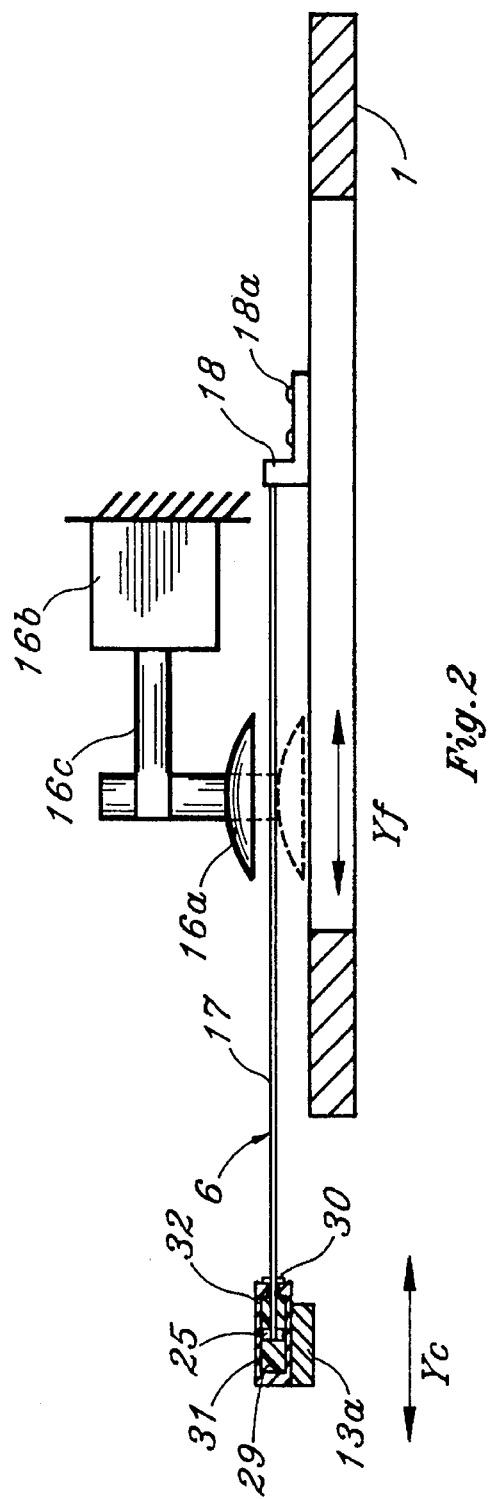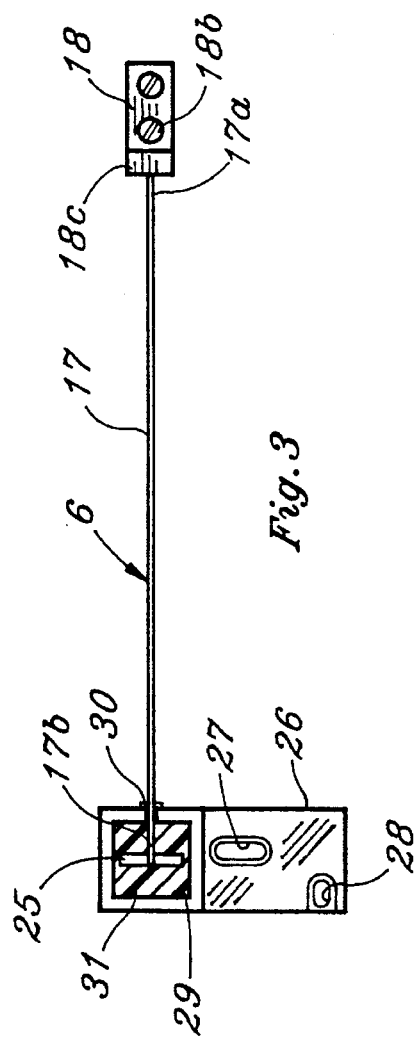
Fig. 2
Fig. 3

FLEXURE SUPPORT FOR A FIXTURE POSITIONING DEVICE

BACKGROUND OF THE INVENTION

This invention relates to fixture positioning devices of the type which require precise positioning in X and Y directions. Such fixture positioning devices are used, for example, in the manufacture of semi-conductor devices or integrated circuits to hold the projection masks and the silicon wafers during the photolithographic process. A typical manufacturing procedure involves moving one fixture carrying the wafer, which is sometimes known as a "wafer theta plate" into approximate position with a coarse positioning device, moving another fixture carrying the photographic mask, sometimes called the "mask theta plate" into approximate position, and then making fine adjustments to precisely align the projection mask and the wafer. A well-known commercially available automatic machine for carrying out this procedure, as well as optical projection printing of mask designs onto wafers for semi-conductors and integrated circuits, is known as MICRALIGN®, manufactured and sold by SVG Lithography Inc. The MICRALIGN machine employs coarse and fine adjusting devices to move the wafer and mask theta plates in X and Y directions. The theta plates are positioned with "flexure supports" connected between the fixture (or theta plate) and the coarse positioning device, which is usually a gear box and motor driving a linkage mechanism. Each flexure member is designed to move the fixture along one axis only, but to permit freedom of movement along an axis which is perpendicular to it. This is accomplished by using a long slender wire running along the first axis, which permits free movement perpendicular to it by flexing of the wire.

While the commercially available fixture positioning devices of this type have been satisfactory in many regards, problems are encountered when attempting to use a fine positioning device to make final adjustments along the axis of the flexure support.

Accordingly, one object of the present invention is to provide an improved flexure support for a fixture positioning device of the type described.

Another object of the invention is to provide an improved flexure support for a wafer theta plate in an optical projection printing unit.

Another object of the invention is to provide an improved flexure support for a photographic mask theta plate in an optical projection printing unit.

SUMMARY OF THE INVENTION

Briefly stated, the invention comprises an improved flexure support for a fixture positioning device of the type having a fixture connected to X and Y coarse positioning devices by means of such flexure supports, and also having X and Y fine positioning devices for selectively engaging the fixture and moving it along the X and Y axes. The improved flexure support comprises a longitudinal slender flexure member extending between the coarse positioning means and the fixture along an axis so as to constrain the fixture to move along the axis and permitting substantial freedom of movement of the fixture in a direction perpendicular to the flexure member by flexing thereof, and a yieldable coupling connected to the flexure member along the axis between the fixture and the coarse positioning means, the yieldable coupling being constructed to permit limited movement of the fixture along the axis while it is being restrained against such movement by the coarse positioning means.

In its preferred form, the yieldable coupling comprises a bracket housing defining a cavity, a bushing disposed in the housing and slidably supporting the longitudinal flexure member, a plate disposed inside the cavity attached to the end of the longitudinal flexure member, and an elastomeric material filling the cavity around the plate, so as to yieldably restrain the plate and longitudinal flexure member within the bracket housing.

DRAWINGS

The subject matter regarded as the invention is particularly pointed out and distinctly claimed in the concluding portion of the specification. The invention, however, both as to organization and method of practice, together with further objects and advantages thereof, may best be understood by reference to the following description, taken in connection with the accompanying drawing, in which:

FIG. 1 is a simplified schematic plan view of a fixture positioning device exemplified as a mask theta plate positioner, FIG. 2 a side elevational view, in cross-section, taken along lines II—II of FIG. 1, FIG. 3 an enlarged plan view, partly in cross-section, illustrating the improved flexure support in its preferred form as used in the FIG. 1 positioner, and FIG. 4 a simplified schematic plan view of an alternate form of fixture positioning device, exemplified as a wafer theta plate positioner.

DESCRIPTION OF THE PREFERRED EMBODIMENT

Figure 1:
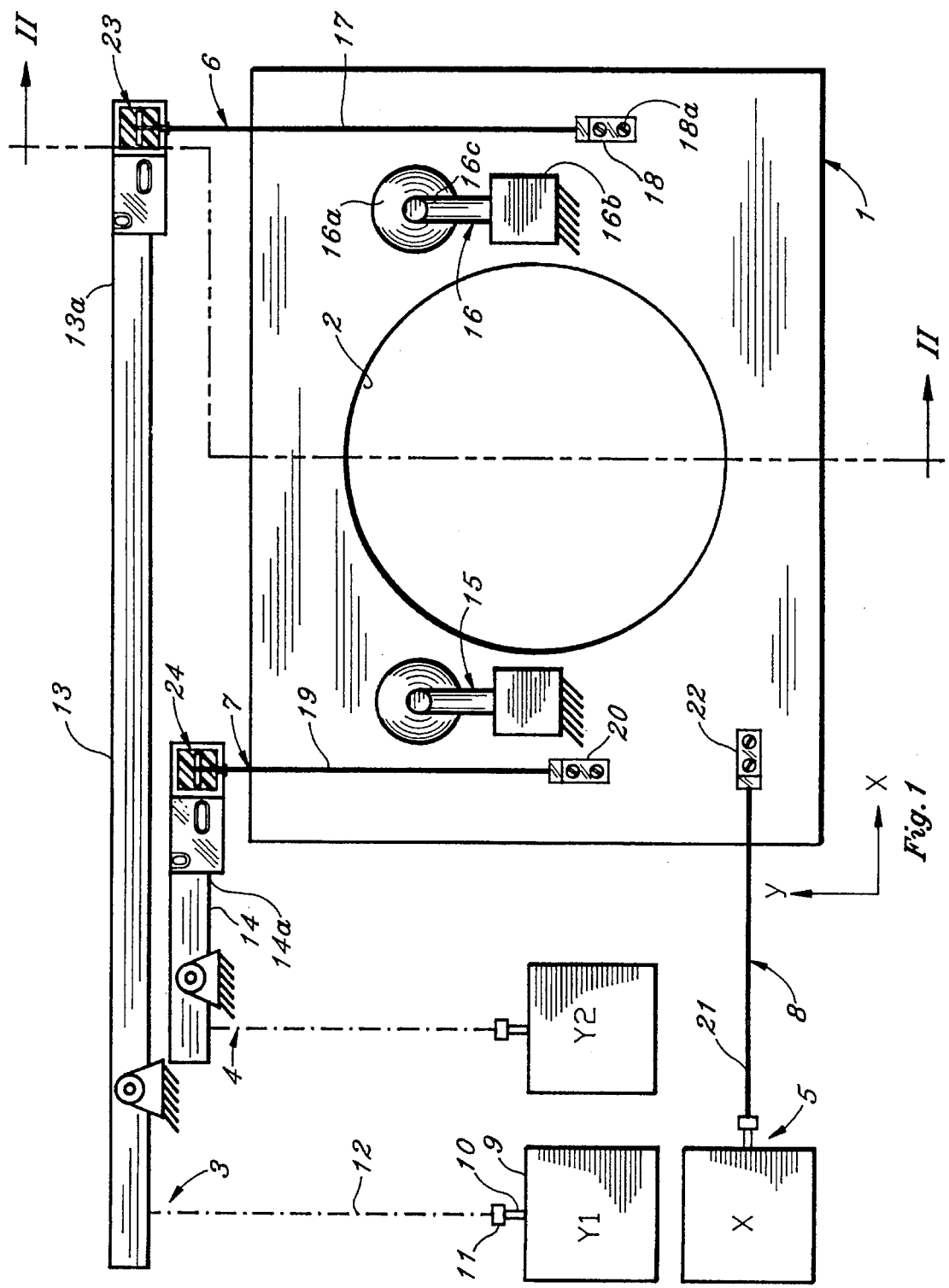

Referring now to the simplified view of FIG. 1, a mask theta plate positioner is shown is schematic form illustrating only the elements which are necessary for an understanding of the invention. A mask theta plate 1 is supported with respect to a base or reference member (not shown) so that it may move freely in the XY plane, which is arbitrarily assumed to be horizontal with respect to the reference member. The mask theta plate includes a central aperture 2 and includes means (not shown) to support a photolithographic mask (not shown) above aperture 2. Coarse positioning devices for moving theta plate 1 in the Y direction include a Y1 coarse positioning device 3, a Y2 coarse positioning device 4, and an X positioning device 5. The Y1 coarse positioning device is connected to a flexure support 6; the Y2 coarse positioning device is connected to a flexure support 7; and the X coarse positioning device is connected to a flexure support 8. Flexure supports 6, 7 and 8 are, in turn, connected to the fixture or theta plate 1.

The mechanical details of the coarse positioning devices 3, 4 and 5 may vary greatly according to the application and the details are immaterial to the present invention. For example, the Y1 coarse positioning device 3 is illustrated as including a gear box and motor 9 which will selectively move an output member 10 in either direction. Gearbox and motor 9 may take several forms, one possible arrangement being a DC stepping motor operated in either direction from a control console (not shown). Output member 10 is connected to a coupling 11, and, in turn through linkage members indicated by phantom line 12 to a lever 13. The end 13a of lever 13 will move substantially along an axis parallel to the Y axis. Coarse positioning means 4 is similarly constructed with a lever 14 having an end 14a adapted to move flexure member 7 along the Y axis. Coarse positioning means 5 moves the fixture 1 along an X axis by means of flexure support 8.

In addition to the coarse positioning means 3, 4 and 5, the fixture positioning device is provided with two fine positioning devices for the Y axis, designated generally as 15 and 16. The fine positioning devices 15, 16 are arranged to selectively engage the fixture and move it in the Y direction.

Reference to FIG. 2 of the drawing illustrates schematically the arrangement and operation of fine positioning device 16. This type of device is well known in the art, but is diagrammatically illustrated as follows. A suction cup 16a is operated by a microstage positioner 16b by means of a connecting linkage 16c. The cup 16a may be caused to selectively engage the fixture 1 as shown in dashed lines, and is then held in place by a vacuum. Thereafter, the micropositioner 16b uses air pressure selectively supplied to an internal diaphragm to operate linkage 16c so as to move the fixture 1 in the Y direction, as indicated by the arrows Yf. The mechanical details of the fine positioning devices 15, 16 are immaterial and other equivalent devices may be employed to selectively engage the fixture and move it along the Y axis. Reference to FIG. 2 illustrates the movement of the end 13a of lever 13 by the Y1 coarse positioning device 3, as indicated by the arrows Yc.

Referring back to FIG. 1 of the drawing, flexure support 6 includes a longitudinal slender flexure member 17 attached to fixture 1 by means of an L-shaped bracket 18 and screws 18a. Similarly, the flexure support 7 includes a slender longitudinal flexure member 19 attached to fixture 1 by means of bracket 20. Lastly, flexure support 8 includes longitudinal slender flexure member 21 attached to fixture 1 by means of bracket 22. The longitudinal flexure members 17, 19, 21 are preferably wire rods of spring steel with diameter on the order of 0.03 inches. Other shapes, such as flat strips could alternatively be employed. When the Y1 and Y2 coarse positioning devices move fixture 1 in the Y direction, the slender longitudinal flexure members 17, 19 constrain fixture 1 to move in the Y direction, or along the respective axes of the flexure members 17, 19. However, when this occurs, longitudinal flexure member 21 on the perpendicular flexure support 8 is moved by bracket 22 perpendicular to its length and because it is slender, it easily flexes to permit motion in the Y direction. Conversely, when the X coarse positioning device 5 moves the fixture in the X direction, or along the axis of longitudinal flexure member 21, motion in the X direction is permitted by flexing of both of the longitudinal slender flexure members 17, 19 in a direction substantially perpendicular to their axes. By this means, either the X or Y coarse positioning devices can position the fixture 1 independently of one another.

The foregoing described construction is well known in the prior art, and used in commercially available fixture positioning devices. However, difficulties are encountered when using fine positioning means to move the fixture 1 against the constraints imposed by the coarse positioning means, which are attempting to hold the fixture in place.

In accordance with the present invention, flexure supports 6, 7 are constructed to incorporate yieldable couplings, shown generally at 23, 24.

Referring to FIG. 3 of the drawing, the flexure support 6 is shown partly in section in greater detail. The bracket 18 is adapted for attachment to fixture 1 by means of screw holes 18b, and has an upright portion 18c with a hole (not shown) receiving one end 17a of the longitudinal slender flexure member 17. The other end 17b of flexure member 17 extends through a hole in a flat plate 25. Ends 17a, 17b are attached to bracket 18 and plate 25, as by welding. A bracket housing 26 is adapted for attachment to the end of lever 13 by means of screws (not shown) which provide for adjustment. Housing 26 defines a rectangular cavity 29 which encloses the plate 25. A brass bushing 30 slidably mounts the longitudinal flexure member 17 in the bracket housing 26, so that the bracket housing 26 can move to a limited degree along the axis of the flexure member 17 with respect to the bracket 18.

Filling the cavity 29 around plate 25 is an elastomeric material 31, such as silicone elastomer, which is commercially available in a number of formulations. The elastomeric material 31 is rigid enough to hold plate 25 in position when coarse positioning means 3 moves the fixture, but yieldable enough when bracket housing 26 is immobilized, to allow plate 25, flexure number 17 and bracket 18 to move to a limited degree along the Y axis. A cover plate 32 (see FIG. 2) may be provided to cover the cavity 29.

OPERATION OF THE PREFERRED EMBODIMENT

Movement of the fixture 1 commences with the fine positioning devices 15, 16 disengaged. The fixture is moved in the X and Y position into the approximate location by operating the Y1, Y2 and X gearboxes. Angular adjustment of the fixture can be provided by operating one Y gearbox in one direction and the other Y gearbox in the opposite direction.

When the fixture 1 is in the approximate desired position, the coarse positioning mechanisms 3, 4 and 5 are stopped and the fixture is immobilized by the inertia of the gearboxes. The fine positioning mechanisms are selectively engaged and the cups attached to the surface of fixture 1 by vacuum. Then the microstage positioners use air pressure to position the fixture more precisely in the Y direction. Although movement of the fixture is restrained in the Y direction by the coarse positioning means, the elastomeric material in the yieldable couplings 23, 24 permits limited movement of the longitudinal flexure members 17, 19 along their respective axes.

MODIFIED FORM OF THE INVENTION

Figure 4:
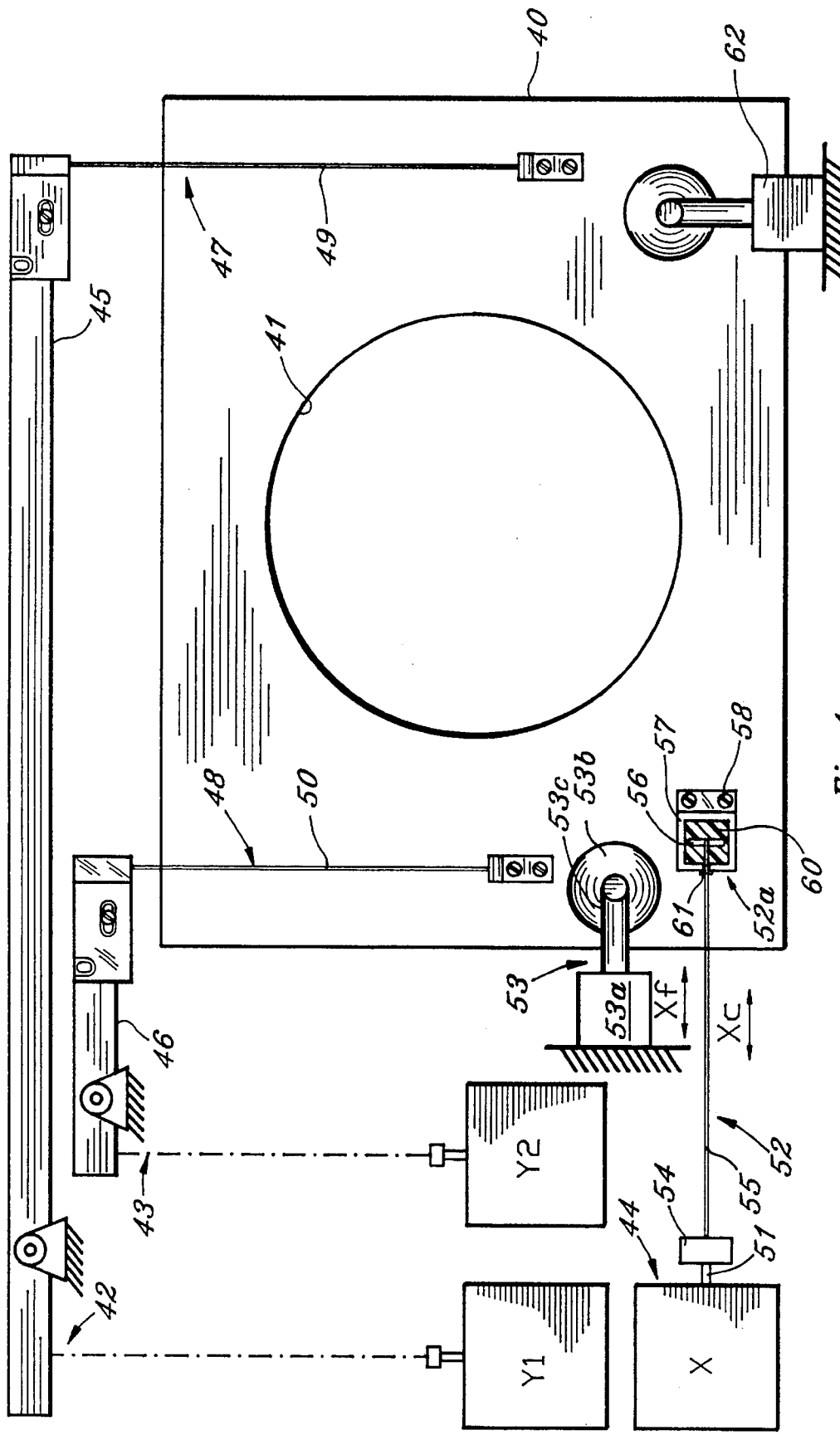

The invention is illustrated in another form in FIG. 4 of the drawing. Referring to FIG. 4, a fixture 40 is freely moveable in the XY plane with respect to the same reference member, assumed to be a horizontal plane. In this case, fixture 40 is a wafer theta plate having a central aperture 41 adapted to contain a silicon wafer. The means for positioning fixture 40 includes a coarse Y1 positioning device 42, a coarse Y2 positioning device 43 and a coarse, X positioning device 44. Coarse positioning devices 42, 43 include levers 45, 46 respectively arranged to move fixture 40 in the Y direction by means of flexure supports shown respectively at 47, 48. Flexure supports 47, 48 include slender longitudinal flexure members 49, 50 respectively, but these are rigidly connected at their respective opposite ends between the levers 45, 46 and fixture 40 without including a yieldable coupling.

Coarse positioning means 44 is adapted to move fixture 40 in the X direction by means of an output member 51. Output member 51 is connected to fixture 40 by flexure support 52 which includes a yieldable coupling 52a, constructed generally as in the preceding example. A fine positioning device 53 for the X direction is used to selectively engage the fixture and move it in the X direction. The fine positioning device 53 for the X direction is constructed as before, having a microstage positioner 53a, and a vacuum cup 53b connected by linkage 53c.

Flexure support 52 includes a bearing mount 54 arranged to be moved by the output member 51 of the coarse positioning means. Bearing mount 54 is attached to one end of a longitudinal flexure member 55. The opposite end of flexure member 55 is connected to a plate 56. A housing bracket 57, attached to fixture 40 by screws 58 defines a cavity containing elastomeric material 60. The longitudinal flexure member 55 enters the cavity through a bushing 61 which slidably mounts the end of flexure member 55 and plate 56 for limited movement within cavity 59.

Operation takes place as previously described. Fixture 40 containing the silicon wafer is moved in an XY direction by the coarse positioning devices 42, 43, 44. Thereafter, the vacuum cup 53b on the fine positioning device 53 is engaged (dashed lines) and makes fine adjustments in the X direction. This is permitted by flexing of the flexure members 49, 50 and, in accordance with the present invention, by the yieldable coupling 52a of flexure support 52.

If desired, an additional fine positioning device 62 may be used as a holding brake to steady the fixture.

While there has been described what is considered to be the preferred embodiment of the invention, other modifications will occur to those skilled in the art, and it is desired to secure in the appended claims all such modifications as fall within the true spirit and scope of the invention.

I claim:

1. An improved flexure support for a fixture positioning device having a fixture adapted to be selectively positioned along a first axis with respect to a reference member, said flexure support being connected to said fixture, coarse positioning means connected to the flexure support and adapted to move the flexure support and fixture along the first axis, and fine positioning means adapted to selectively engage the fixture and move it along the first axis, wherein said flexure support comprises:

a longitudinal slender flexure member extending between the coarse positioning means and the fixture along the first axis so as to constrain the fixture to move along the first axis while permitting substantial freedom of movement of the fixture in a direction perpendicular to the flexure member by flexing thereof, and a yieldable coupling connected to said flexure member along the first axis between the fixture and the coarse positioning means, said yieldable coupling being constructed to permit limited movement of the fixture along the first axis while it is being restrained against such movement by the coarse positioning means.

2. The combination according to claim 1, wherein said yieldable coupling comprises a bracket housing defining a cavity, a plate disposed inside the cavity and attached to one end of the flexure member, and a yieldable material filling the cavity around the plate.

3. The combination according to claim 2, and further including a bushing disposed in the bracket housing and slidably supporting the flexure member.

4. The combination according to claim 2, wherein said yieldable material is a silicone elastomer.

5. The combination according to claim 2, wherein said bracket housing is adapted for attachment to said coarse positioning means, and further including a bracket adapted for attachment to said fixture.

6. The combination according to claim 2, wherein said bracket housing is adapted for attachment to said fixture, and further including a bracket adapted for attachment to said coarse positioning means.

7. The combination according to claim 1, wherein said longitudinal slender flexure member is a long straight wire member.

8. An improved flexure support for a fixture positioning device having a fixture adapted to be selectively positioned along a first axis with respect to a reference member, said flexure support being connected to said fixture, coarse positioning means connected to the flexure support and adapted to move the flexure support and fixture along the first axis, and fine positioning means adapted to selectively engage the fixture and move it along the first axis, wherein said flexure support comprises:

a longitudinal slender flexure member having opposed ends and extending between the coarse positioning means and the fixture along the first axis so as to constrain the fixture to move along the first axis while permitting substantial freedom of movement of the fixture in a direction perpendicular to the flexure member by flexing thereof, a bracket housing defining a cavity, a plate disposed in said cavity, and connected to one end of the flexure member, a yieldable elastomer disposed in the cavity on either side of the plate, said elastomer being sufficiently rigid to allow the coarse positioning means to move the fixture, but sufficiently elastic to permit limited movement of the fixture along the first axis when it is being constrained by the coarse positioning means, and a bracket connected to the other end of the flexure member and adapted for connecting to another element.

* * * * *